United States Patent
Berry et al.

(10) Patent No.: US 10,573,517 B2
(45) Date of Patent: Feb. 25, 2020

(54) EPITAXIAL GROWTH OF DEFECT-FREE, WAFER-SCALE SINGLE-LAYER GRAPHENE ON THIN FILMS OF COBALT

(71) Applicants: SunEdison Semiconductor Limited (UEN201334164H), Singapore (SG); The Board of Trustees of the University of Illinois, Urbana, IL (US)

(72) Inventors: Vikas Berry, Chicago, IL (US); Sanjay Behura, Chicago, IL (US); Phong Nguyen, Witchita, KS (US); Michael R. Seacrist, Lake St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/764,370

(22) PCT Filed: Sep. 28, 2016

(86) PCT No.: PCT/US2016/054202
§ 371 (c)(1),
(2) Date: Mar. 29, 2018

(87) PCT Pub. No.: WO2017/058928
PCT Pub. Date: Apr. 6, 2017

(65) Prior Publication Data
US 2018/0315599 A1    Nov. 1, 2018

Related U.S. Application Data

(60) Provisional application No. 62/235,800, filed on Oct. 1, 2015.

(51) Int. Cl.
*C01B 32/184* (2017.01)
*C30B 25/18* (2006.01)
(Continued)

(52) U.S. Cl.
CPC ...... *H01L 21/02527* (2013.01); *C01B 32/184* (2017.08); *C30B 25/18* (2013.01);
(Continued)

(58) Field of Classification Search
CPC .... C01B 32/184; H01L 29/1606; C30B 25/18
See application file for complete search history.

(56) References Cited

U.S. PATENT DOCUMENTS 8,158,200 B2   4/2012   Kelber
8,809,855 B2   8/2014   Yamazaki et al.
(Continued)

FOREIGN PATENT DOCUMENTS

CN   102064189 A   5/2011
JP   2009107921 A   5/2009
(Continued)

OTHER PUBLICATIONS

"Epitaxial Chemical Vapor Deposition Growth of Single-Layer Graphene over Cobalt Film Crystallized on Sapphire" (ACS Nano, 2010, 4 (12), pp. 7407-7414, Nov. 24, 2010 (Article)) (Year: 2010).*
(Continued)

*Primary Examiner* — Kenneth Parker
*Assistant Examiner* — Long H Le
(74) *Attorney, Agent, or Firm* — Armstrong Teasdale LLP

(57) ABSTRACT

A method for depositing a layer of graphene directly on the surface of a substrate, such as a semiconductor substrate is provided. Due to the strong adhesion of graphene and cobalt to a semiconductor substrate, the layer of graphene is epitaxially deposited.

19 Claims, 5 Drawing Sheets

(51) Int. Cl.
  *C30B 29/02*  (2006.01)
  *H01L 21/02*  (2006.01)
  *H01L 29/16*  (2006.01)

(52) U.S. Cl.
  CPC ............ *C30B 25/183* (2013.01); *C30B 29/02* (2013.01); *H01L 21/0242* (2013.01); *H01L 21/0262* (2013.01); *H01L 21/02378* (2013.01); *H01L 21/02381* (2013.01); *H01L 21/02389* (2013.01); *H01L 21/02392* (2013.01); *H01L 21/02395* (2013.01); *H01L 21/02488* (2013.01); *H01L 21/02491* (2013.01); *H01L 21/02502* (2013.01); *H01L 21/02658* (2013.01); *H01L 29/1606* (2013.01)

(56) References Cited

U.S. PATENT DOCUMENTS

| | | | |
|---|---|---|---|
| 8,884,310 | B2 | 11/2014 | Seacrist et al. |
| 9,029,226 | B2 | 5/2015 | Tsai et al. |
| 9,355,842 | B2 | 5/2016 | Seacrist et al. |
| 2011/0033677 | A1 | 2/2011 | Shin et al. |
| 2011/0042687 | A1 | 2/2011 | Chu et al. |
| 2011/0092030 | A1* | 4/2011 | Or-Bach ............ G06F 17/5072 438/129 |
| 2012/0042922 | A1 | 2/2012 | Kondo et al. |
| 2012/0138675 | A1 | 6/2012 | Narendra et al. |
| 2012/0325296 | A1 | 12/2012 | Woo et al. |
| 2013/0240830 | A1* | 9/2013 | Seacrist ............ H01L 21/02458 257/9 |
| 2014/0004656 | A1 | 1/2014 | Sasagawa et al. |
| 2014/0120270 | A1 | 5/2014 | Tour et al. |
| 2014/0234200 | A1 | 8/2014 | Tour et al. |
| 2014/0361408 | A1 | 12/2014 | Falster et al. |
| 2015/0014600 | A1* | 1/2015 | Jeon ........................ H01B 1/04 252/502 |
| 2016/0176713 | A1 | 6/2016 | Loh et al. |
| 2017/0283980 | A1 | 10/2017 | Narushima et al. |

FOREIGN PATENT DOCUMENTS

| | | |
|---|---|---|
| JP | 2009143799 A | 7/2009 |
| JP | 2011063506 A | 3/2011 |
| JP | 2013513544 A | 4/2013 |
| WO | 2011075158 A1 | 6/2011 |

OTHER PUBLICATIONS

Ago, Hiroki et al., "Epitaxial CVD growth of single-layer graphene over cobalt film crystallized on sapphire" Institute for Materials Chemistry and Engineering, Kyushu University, Graduate School of Engineering Sciences, Kyushu Univeristy, PRESTO_JST, Supporting Information, pp. 1-6.

International Search Report and Written Opinion of the International Searching Authority regarding PCT/US2016/054202 dated Jan. 26, 2017; pp. 1-12.

Su, Ching-Yuan, et al., Direct Formation of Wafer Scale Graphene Thin Layers on Insulating substrates by Chemical Vapor Deposition, NANO Letters, American Chemical Society, Aug. 11, 2011, pp. 3612-3616, vol. 11.

Peng, Zhiwei, et al., Direct Growth of Bilayer Graphene on SiO2 Substrates by Carbon Diffusion though Nickel, ACS Nano, 2011, pp. 8241-8247, vol. 5, No. 10.

Geim, A.K. et al., The Rise of Graphene, nature materials, Mar. 2007, pp. 183-191, vol. 6, Nature Publishing Group.

First, Phillip N. et al., Epitaxial Graphenes on Silicon Carbide, MRS Bulletin, Apr. 2010, pp. 296-305, vol. 35, www.mrs.org/bulletin.

Bae, Sukang et al., Roll-to-roll production of 30-inch graphene films for transparent electrodes, Nature Nanotechnology, 2010, pp. 1-7, Macmillan Publishers Limited, www.nature.com/naturenanotechnology.

Yan, Zheng, et al., Growth of Bilayer Graphene on Insulting Substrates, ASC NANO, Just Accepted Manuscripts, Sep. 2, 2011, pp. 20, http://pubs.acs.org.

Berry, Vikas et al., Graphene-Based Single-Bacterium Resolution Biodevice and DNA Transistor: Interfacing Graphene Derivatives with Nanoscale and Microscale Biocomponents, Nano Lett., 2008, pp. 4469-4476, vol. 8, No. 12, ACS Publications, Washington, DC.

Kim, Deun Soo, et al., Large-scale pattern growth of graphene films for stretchable transparent electrodes; Letters, nature, 2009, doi:10.1038/nature07719, pp. 1-5.

Reina, Alfonso, Large Area, Few-Layer Graphene Films on Arbitrary Substrates by Chemical Vapor Deposition, Nano Letters, 2009, vol. 9, No. 1, 30-35, ACS Publications, Washington DC.

Li, et al., Synthisis, Characterization, and Properties of Large-Area Graphene Films,ECS Transactions, 2009, pp. 41-51, vol. 19, No. 5,The Electrochemical Society.

Hiroki Ago et al: "Epitaxial Chemical Vapor Deposition Growth of Single-Layer Graphene over Cobalt Film Crystallized on Sapphire", ACS NANO, vol. 4, No. 12, (Dec. 28, 2010), pp. 7407-7414, XP055336545, ISSN: 1936-0851, DOI: 10.1021/nn102519b.

Eunho Kim et al: "Growth of Few-Layer Graphene on a Thin Cobalt Film on a Si/Si02 Substrate", Chemical Vapor Deposition., vol. 17, No. 1-3, (Mar. 24, 2011), pp. 9-14, XP055336568, ISSN: 0948-1907, DOI: 10.1002/cvde.201004296.

Michael E. Ramon et al: "CMOS-Compatible Synthesis of LargeArea, High-Mobility Graphene by Chemical Vapor Deposition of Acetylene on Cobalt Thin Films", ACS NANO, vol. 5, No. 9, (Sep. 27, 2011), pp. 7198-7204, XP055336574, ISSN: 1936-0851, DOI: 10.1021/nn202012m.

Mi Zhou et al: "Fast Track Communication;Direct graphene growth on Co3O4(111) by molecular beam epitaxy; Direct graphene growth on Co3O4(111) by molecular beam epitaxy", Journal of Physics: Condensed Matter, Institute of Physics Publishing, Bristol, GB, vol. 24, No. 7, (Jan. 6, 2012), p. 72201, XP020217753, ISSN: 0953-8984, DOI: 10.1088/0953-8984/24/7/072201.

* cited by examiner

… … …

EPITAXIAL GROWTH OF DEFECT-FREE, WAFER-SCALE SINGLE-LAYER GRAPHENE ON THIN FILMS OF COBALT

CROSS REFERENCE TO RELATED APPLICATION(S)

This application is a National Stage application of International Application No. PCT/US2016/054202, filed on Sep. 28, 2016, which claims priority to U.S. Provisional Application Ser. No. 62/235,800 filed Oct. 1, 2015. The disclosures of the priority document are incorporated by reference as set forth in its entirety.

FIELD OF THE INVENTION

The field of the invention relates generally to a method for producing atomically thick sheets of graphene on a substrate, such as a semiconductor substrate, and more specifically to a method for producing layers of atomically thick sheets of graphene on a cobalt layer, which is in contact with the semiconductor substrate.

BACKGROUND OF THE INVENTION

A single atom thick, graphene is the youngest allotrope of carbon and in the last decade it has become one of the most researched material in the scientific community because of its excellent optical, mechanical, and electrical properties. Graphene is the hexagonal arrangement of carbon atoms forming a one-atom thick planar sheet of $sp^2$ hybridized (double bonded) carbon atoms arranged in a honeycomb lattice. Graphene is a promising electronic material. It has the potential to significantly impact the semiconductor industry due to its superior electrical, thermal, mechanical, and optical properties while at the same time offering compatibility with existing semiconductor processing techniques. Graphene has shown extraordinary applications, including single molecule detection, ultrafast FETs, hydrogen visualization-template for TEM, and tunable spintronic devices. Furthermore, it exhibits high thermal conductivity (25× silicon), high mechanical strength (strongest nanomaterial), high optical transparency (80%), carrier controlled interband/optical-transition, and flexible structure. Electronically, graphene is a semi-metal with zero band-gap owing to the conduction band touching the valence band at two points (K and K') in the Brillouin zone. Graphene's high density of π-electrons from the $sp^2$ carbon atoms and carrier-confinement in an open crystallographic structure imparts it with the highest mobility measured to date.

In order to realize these benefits in volume manufacturing, paths to integrating graphene on large diameter semiconductor, e.g., silicon, substrates are necessary. Current processes require graphene to be transferred from a metal base to the desired substrate. This transfer process of an atomically-thick sheet is challenging and leads to low yield and a significant density of folds and tears.

Since the successful isolation, identification, and characterization of graphene by A. Geim and K. Novoselov in 2004, the most common method for producing flakes of graphene has been by tape exfoliation from graphite and transfer to an oxidized silicon wafer. The transfer process for graphene from a metal (a) is not feasible for large scale synthesis due to inconsistent coverage, (b) leaves transfer polymer residue on graphene (PMMA, PDMS, thermal-adhesive-tape) increasing carrier-scattering, and (c) produces folds, wrinkles, and tears. Therefore, transfer of graphene is not feasible for industrial processing. Clearly, the scotch-tape method is not scalable for semiconductor industry. As a result of these deficiencies, this method produces small, irregularly shaped flakes of graphene and is not suitable for scaling to large diameter integration with silicon. See A. K. Geim and K. S. Novovselov, "The Rise of Graphene" Nature Materials 6 (2007) 183-191.

Research into producing wafer level graphene and large area sheets of graphene has produced the development of two main options.

First, W. deHeer's group at Georgia Institute of Technology has demonstrated the formation of graphene layers on SiC wafer by silicon sublimation and out-diffusion at very high temperature. The disadvantage of this technique is the high cost of SiC wafers, the smaller diameter SiC wafers, and the absence of integration scale possible on silicon wafers. Some groups are working on depositing SiC on Silicon and attempting to form graphene on the deposited SiC layer. See P. First, W. deHeer et al, "Epitaxial Graphenes on Silicon Carbide" MRS Bulletin 35, 296-305 (2010).

Groups in Korea and the University of Texas system have demonstrated graphene formation on metal foils such as Cu and Ni. See S. Bae et al, "Roll-to Roll Production of 30 inch Graphene Films for Transparent Electrodes" Nature Nanotechnology 5, 574-578 (2010) and X. Li et al, ECS Transactions, "Synthesis, Characterization, and Properties of Large-Area Graphene Films" 19 (5), 41-52 (2005). Using a carbon source such as methane mixed with hydrogen at temperatures in the 700-1000° C. range in a CVD chamber at pressure such as 500 millitorr, carbon is absorbed into the metal film and upon cooling segregates or precipitates to the surface of the metal foil forming single or multi-layer graphene depending on the process conditions and the metal foil. The graphene layer then has to be transferred to oxidized silicon. The transfer process generally uses a material like PMMA on graphene followed by dissolution of the metal foil, then graphene is interfaced to the silicon dioxide layer, and finally the PMMA is removed leaving graphene on $SiO_2$ on Silicon. Although the graphene formation on metal foils enables large sheets of graphene to be produced, the process for transferring large area graphene sheets to large diameter silicon substrates for electronic device fabrication is challenging. Issues such as film stress, chemical residues, bonding defects, and wrinkles in the graphene film are likely to be significant challenges for a manufacturable process.

BRIEF DESCRIPTION OF THE INVENTION

Briefly, the present invention is directed to a method of forming a multilayer structure, the method comprising: epitaxially depositing a graphene layer on a layer comprising cobalt, wherein the layer comprising cobalt is in contact with a dielectric layer, and further wherein the dielectric layer is in contact with a front wafer surface of a semiconductor wafer.

The present invention is further directed to a multilayer structure comprising: a semiconductor wafer, the semiconductor wafer comprising a front wafer surface, a back wafer surface, and a circumferential wafer edge joining the front wafer surface and the back wafer surface; a dielectric layer in contact with the front wafer surface of the semiconductor wafer; a layer comprising cobalt in contact with the dielectric layer, the layer comprising cobalt comprising a front layer surface, a back layer surface, and a bulk layer region between the front layer surface and the back layer surface, wherein the back layer surface is in contact with the dielectric layer; and a graphene layer in contact with the front layer surface of the layer comprising cobalt.

BRIEF DESCRIPTION OF THE DRAWINGS

FIG. 2A is the spectra after E-beam evaporation. FIG. 2B is the spectra after heating to 1000° C. FIG. 2C is the spectra after heating to 1000° C. and annealing for 10 min. FIG. 2D is the spectra after graphene growth.

DETAILED DESCRIPTION OF THE EMBODIMENT(S) OF THE INVENTION

The present invention is directed to a method for forming graphene directly on a substrate, e.g., a semiconductor substrate, such as a semiconductor wafer, which optionally comprises a dielectric layer. By direct, it is meant that the graphene is formed on the substrate without layer transfer. According to some embodiments of the method of the present invention, a layer comprising cobalt is deposited on the front surface of a semiconductor substrate, such as a semiconductor wafer, which optionally comprises a dielectric layer. Thereafter, a layer of graphene is formed on the layer comprising cobalt. The present invention is therefore additionally directed to a multilayer article comprising a semiconductor substrate, a layer comprising cobalt, and a layer of graphene. Advantageously, the method of the present invention enables coating at least a portion of a large diameter semiconductor wafer, e.g., a silicon wafer coated with silicon dioxide, with at least a layer of graphene.

This invention relies on the high-quality, defect-free, single-layer graphene with maximum coverage on thin films of cobalt (Co) on $SiO_2$/Si substrate via high temperature, and low-pressure chemical vapor deposition of a carbon-containing gas on the cobalt surface. The graphene formation on Co is precipitation-based due to high carbon solubility (0.9 wt %) in Co at high temperature (1320° C.). Since the grain size of Co is increased, during the high temperature growth, surface nucleation of graphene is dominant and the graphene is able to grow in large single crystal (several micrometers). Furthermore, since the cooling stage is fast, the precipitation of carbon radical forms single-layer on the surface of the Cobalt. Due to the strong adhesion of graphene and cobalt, the growth is preferably epitaxial.

I. Substrates for Layer Deposition

Figure 1A:
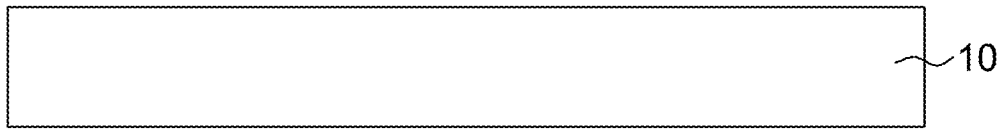
FIGS. 1A through 1D depict the process flow according to an embodiment of the present invention.

According to the method of the present invention, the graphene layer or layers is/are formed directly on a semiconductor substrate, i.e., without a layer transfer step. With reference now to FIG. 1A, a semiconductor substrate 10 may comprise two major, generally parallel surfaces, one of which is a front surface of the substrate and the other of which is a back surface of the substrate. A circumferential edge joins the front and back surfaces, and a central plane lies between the front and back surfaces. The substrate 10 comprises a bulk region between the front and back surfaces. Prior to any operation as described herein, the front surface and the back surface of the substrate 10 may be substantially identical. A surface is referred to as a "front surface" or a "back surface" merely for convenience and generally to distinguish the surface upon which the operations of method of the present invention are performed. In some embodiments of the present invention, the operations of the invention are performed on the front surface of the semiconductor substrate 10. In some embodiments of the present invention, the operations of the present invention are performed on both the front surface and the back surface of the semiconductor substrate 10.

In some embodiments, the semiconductor substrate 10 comprises a semiconductor wafer. In some embodiments, the semiconductor material may be selected from the group consisting of silicon, silicon carbide, sapphire, aluminum nitride, silicon germanium, gallium arsenide, gallium nitride, indium phosphide, indium gallium arsenide, germanium, and combinations thereof. In some preferred embodiments, the semiconductor wafer comprises a material selected from among silicon, silicon carbide, silicon germanium, gallium arsenide, gallium nitride, indium phosphide, indium gallium arsenide, and germanium. The semiconductor wafer may comprise combinations of such materials, e.g., in a multilayer structure. In general, the semiconductor wafer has a diameter of at least about 20 mm, more typically between about 20 mm and about 500 mm. In some embodiments, the diameter is at least about 20 mm, at least about 45 mm, at least about 90 mm, at least about 100 mm, at least about 150 mm, at least about 200 mm, at least about 250 mm, at least about 300 mm, at least about 350 mm, or even at least about 450 mm. The semiconductor wafer may have a thickness between about 100 micrometers and about 5000 micrometers, such as between about 100 micrometers and about 1500 micrometers, suitably within the range of about 500 micrometers to about 1000 micrometers.

In particularly preferred embodiments, the semiconductor wafer comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). In some preferred embodiments, the semiconductor silicon substrate is a polished silicon wafer grown by the CZ method. The silicon substrate may have any crystal orientation, e.g., (100), (110), and (111).

Silicon wafer resistivity is not critical to forming a graphene layer on the substrate. However, resistivity may vary depending upon end use requirements. In view thereof, the wafer may be heavily doped, may be semi-insulating, or may have a doping profile somewhere between. The resistivity may therefore vary from milliohm or less to megaohm or more. In some embodiments, the single crystal semiconductor wafer comprises a p-type or an n-type dopant. Suitable dopants include boron (p type), gallium (p type), phosphorus (n type), antimony (n type), and arsenic (n type). The dopant concentration is selected based on the desired resistivity of the wafer. In some embodiments, the wafer types may have resistivity so that they can be characterized as any of N++ type, N+ type, N type, N− type, and N−− type. Typical N+ resistivity ranges are as low as 10 milliohm-cm for Sb doping, N++ as low as 2 milliohm-cm for As doping, and N+++ as low as 1 milliohm-cm for P doping. Specification ranges are usually 2-3× for max/min due to segregation in crystal growth. In some embodiments, the wafer types may have resistivity so that they can be characterized as any of P++ type, P+ type, P type, P− type, and P−− type.

Typical P+ resistivity range is as low as 10 milliohm-cm and P++ as low as 5 milliohm-cm. Specification ranges are usually 1.5-2× for max/min due to segregation in crystal growth. The resistivity of the wafer may therefore vary from about 0.1 milliohm-cm to about 10 kiloohm-cm. In some embodiments, the resistivity may range from about 0.1 milliohm-cm to about 1 kiloohm-cm, such as from 0.1 milliohm-cm to about 100 ohm-cm, such as from 0.1 milliohm-cm to about 10 ohm-cm, or from about 0.1 milliohm-cm to about 1 ohm-cm. Substrate are also available in lightly doped form, such as nominal values of 1 ohm-cm or 10 ohm-cm or 100 ohm-cm, in both N-type (Phos) and P-type (Boron). Choice of substrate resistivity depends on application (example if substrate is used as backgate then lower resistivity is preferred) but should not impact growth of the graphene layer.

Figure 1B:
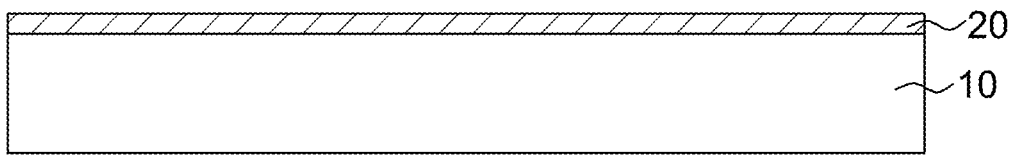

With reference now to FIG. 1B, in some embodiments of the method of the present invention, one or more of the major surfaces of the semiconductor substrate 10 may be modified with a dielectric layer 20. The dielectric layer may comprise silicon dioxide, silicon nitride, silicon oxynitride, or a combination of silicon dioxide and silicon nitride layers. In some preferred embodiments, the semiconductor substrate 10 comprises a silicon wafer, the front surface layer of which is oxidized. In preferred embodiments, the front surface layer, i.e., the layer upon which the metal film is deposited, is oxidized. In preferred embodiments wherein the semiconductor substrate 10 comprises a silicon wafer, the front surface of the silicon wafer is preferably oxidized such that the front surface layer of the silicon wafer comprises a silicon dioxide ($SiO_2$) dielectric layer 20 having a thickness between about 10 nm and about 1000 nm, between about 30 nm and about 1000 nm, between about 50 nm and about 500 nm, preferably between about 50 nm and about 300 nm, such as between about 90 nm and about 300 nanometers thick, or between about 90 nm and about 200 nanometers thick. Deposition of the dielectric layer may be accomplished by means known in the art, such as thermal oxidation (in which some portion of the deposited semiconductor material film will be consumed) and/or CVD oxide and/or nitride deposition. In some embodiments, the wafer may be thermally oxidized (in which some portion of the deposited semiconductor material film will be consumed) or the film may be grown by CVD oxide and/or nitride deposition. In some embodiments, the wafer may be thermally oxidized in a furnace such as an ASM A400. The front surface of the silicon wafer may be thermally oxidized via wet or dry oxidation, as is known in the art. Oxidation generally occurs at temperatures between about 800° C. and about 1200° C. using water vapor and/or oxygen. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, semiconductor wafers may be loaded into a vertical furnace, such as an A400. The temperature is ramped to the oxidizing temperature with a mixture of $N_2$ and $O_2$. After the desired oxide thickness has been obtained, the $O_2$ is turned off and the furnace temperature is reduced and wafers are unloaded from the furnace.

In some embodiments, the semiconductor substrate 10 may comprise a dielectric layer 20 comprising silicon nitride. In some embodiments, the semiconductor substrate 10 comprises a silicon wafer, the front surface layer of which is oxidized as described above, which is followed by deposition of a silicon nitride layer. A silicon nitride layer may be deposited on the silicon oxide layer since silicon nitride advantageously forms a barrier layer to reduce diffusion of metal atoms, e.g., nickel, into the silicon oxide layer. In some embodiments, the silicon nitride layer may range in thickness between about 10 nm and about 1000 nm, between about 30 nm and about 1000 nm, or from about 50 nanometers to about 1000 nanometers. In some embodiments, the silicon nitride layer may range in thickness from about 50 nanometers to about 500 nanometers. In some embodiments, the silicon nitride layer may range in thickness from about 70 nanometers to about 250 nanometers. The thickness of the silicon nitride layer is determined in view of the trade-off between device performance, such that thinner layers are preferred, and an effective barrier to prevent in-diffusion of impurities into the semiconductor substrate, such that thicker layers are preferred. Silicon nitride may be deposited on the surface of the silicon oxide layer by contacting the substrate with an atmosphere of nitrogen at elevated temperature. For example, the semiconductor may be exposed to nitrogen gas or ammonia at temperatures ranging from about 700° C. to about 1300° C. In some embodiments, silicon nitride is formed by chemical vapor deposition at about 800° C. In order to incorporate nitrogen and oxygen to deposit silicon oxynitride, the atmosphere may comprise a combination of oxygen and nitrogen, and the temperature may be increased to a temperature between 1100° C. and 1400° C. An alternative nitrogen source is ammonia.

In some embodiments, the semiconductor substrate 10 comprising the dielectric layer 20 is cleaned prior to deposition of the layer comprising cobalt, for example to remove organic matter or other impurities. A suitable cleaning solution is the piranha solution, which comprises $H_2SO_4$ (concentrated) and $H_2O_2$ (30% solution), typically in a 3:1 ratio, but other ratios, such as 4:1 or 7:1 are suitable. Cleaning duration is suitably between about 15 minutes and about 2 hours.

II. Deposition of Layer comprising Cobalt

Figure 1C:
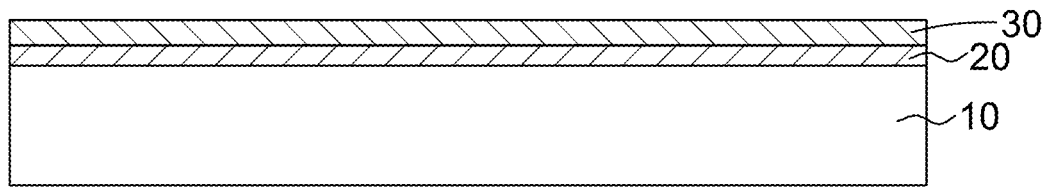

With reference to FIG. 1C, according to the method of the present invention, the major surface of the semiconductor substrate 10, e.g., a silicon wafer comprising a dielectric layer 20, e.g., a silicon oxide layer and optionally a silicon nitride layer and/or a silicon oxynitride layer, is coated with a layer comprising cobalt 30. In some embodiments, the layer comprising cobalt 30 may be deposited over the entire major surface of the semiconductor substrate 10 comprising a dielectric layer 20. In some embodiments, the layer comprising cobalt 30 may be deposited over a portion of the semiconductor substrate 10 comprising a dielectric layer 20, such as at least about 10% of the total area of the major surface, or at least about 25% of the total area, or at least about 50% of the total area, or at least about 75% of the total area. In some embodiments, the layer comprising cobalt 30 may be deposited over the entire major surface of the semiconductor substrate 10 comprising a dielectric layer 20 and thereafter metal may be removed selectively, using conventional lithography techniques, to thereby leave a desired pattern of metal deposition on the major surface of the substrate. In some embodiments, the front surface layer of the semiconductor substrate 10 comprising a dielectric layer 20 is coated with a layer comprising cobalt 30. The front surface layer may be completely coated with cobalt, partially coated with cobalt, or coated with a cobalt pattern by lithography. In some embodiments, the semiconductor substrate 10 comprises a semiconductor wafer having a dielectric layer 20 thereon. In some embodiments, the semiconductor substrate 10 comprises a silicon wafer having a silicon dioxide front surface layer, and the layer comprising cobalt 30 is deposited onto the silicon dioxide front surface layer. The silicon dioxide layer may be completely coated with cobalt, partially coated with cobalt, or coated with a cobalt pattern by lithography. In some embodiments, the semiconductor substrate 10 comprises a silicon wafer having a silicon dioxide layer and a silicon nitride front surface layer, and the layer comprising cobalt 30 is deposited onto the silicon nitride front surface layer. The silicon nitride layer may be completely coated with cobalt, partially coated with cobalt, or coated with a cobalt pattern by lithography. For the sake of convenience, the surfaces of the layer comprising cobalt 30 may be referred to as a "front cobalt layer surface" and "a back cobalt layer surface." Herein, the back cobalt layer surface is in contact with the dielectric layer 20. The graphene layer is deposited on the front cobalt layer surface. A bulk metal region is between the front and back cobalt layer surfaces.

The layer comprising cobalt 30 may be deposited by techniques known in the art, including sputtering, evaporation, electron-beam evaporation, ion beam evaporation, chemical vapor deposition, electrolytic plating, and metal foil bonding. In some embodiments, the layer comprising cobalt 30 is deposited by sputtering or evaporation using, e.g., a Sputtering and Metal evaporation Unit. In some embodiments, a cobalt layer may be deposited via electron-beam evaporation technique in a clean room environment, using, for example, a Varian Electron Beam Evaporator. Electrolytic metal plating may occur according to the methods described by Supriya, L.; Claus, R. O. Solution-Based Assembly of Conductive Gold Film on Flexible Polymer Substrates:Langmuir 2004, 20, 8870-8876. In some embodiments, the layer comprising cobalt 30 may be deposited by chemical vapor deposition at relatively low temperatures, such as between about 100° C. and about 300° C., such as about 200° C. Preferably, the layer comprising cobalt 30 is between about 50 nanometers and about 20 micrometers thick, such as between about 50 nanometers and about 10 micrometers thick, such as between about 50 nanometers and about 1000 nanometers (1 micrometer), such as between about 100 nanometers and about 500 nanometers, such as between about 100 nanometers and about 400 nanometers, such as about 300 nanometers or about 500 nanometers.

The use of cobalt for the deposition of a graphene layers is advantageous since, unlike copper (with carbon solubility of 0.01 wt % at 1084° C.), the graphene formation in Co is precipitation-based. This is due to the high carbon solubility (0.9 wt %) in Co at high temperature (1320° C.). Accordingly, the carbon prefers to precipitate near the grain boundaries during cooling. It has been observed that high temperature growth enhances the rapid precipitation and surface nucleation so that graphene nuclei try to attach to each other preferentially in the same orientation resulting epitaxial growth of large coverage single-layer graphene.

After deposition of the metal film, the multilayer structure may be cleaned. The multilayer structure comprises the semiconductor substrate 10, dielectric layer 20 (e.g., silicon dioxide, which may additionally comprise a silicon nitride layer), and a layer comprising cobalt 30. In some preferred embodiments, the multilayer structure may be cleaned by heating the structure in a vacuum furnace in a reducing atmosphere. A chemical vapor deposition system may be used where only baking under high vacuum is performed. In preferred embodiments, the reducing atmosphere comprises hydrogen gas or other reducing gas. An inert carrier gas may be used, such as argon or helium. In preferred embodiments, the temperature during exposure to the reducing atmosphere is preferably between about 800° C. and about 1200° C., such as about 1000° C. The pressure is preferably sub-atmospheric, such as less than about 100 Pa (less than about 1 Torr), preferably less than about 1 Pa (less than about 0.01 Torr), even more preferably less than about 0.1 Pa (less than about 0.001 Torr), and even more preferably less than about 0.01 Pa (less than about 0.0001 Torr). The cleaning anneal may adjust the grain size of the metal film, e.g., increase the grain size at elevated temperatures.

After heat treatment, the multilayer substrate (FIG. 1C) is analyzed by X-ray diffraction to confirm crystallographic orientations. The X-ray diffraction analysis reveals a single crystalline Co film on $SiO_2$/Si substrate, which enables the formation of very-high quality graphene. Annealing the multilayer structure after deposition of the layer comprising cobalt promotes epitaxial growth, as confirmed by analyzing the Co surface before and after annealing via X-ray diffraction (XRD). See FIGS. 2A through 2D. That is, before anneal, the XRD pattern for room temperature (RT) evaporated Co reveals three diffraction peaks. See FIG. 2A. The strong peak at 44° corresponds to either hexagonal closed packed (hcp) Co(0002) or face centered cubic (fcc) Co(111). See Ago et al., ACS Nano, 4, 7407 (2010). The XRD pattern for non-annealed cobalt also reveals another two weak peaks are also observed at 42° (Co(200)) and 47° (hcp Co(101)). See J. Mater. Chem., 2009, 19, 7371-7378. These results confirm the polycrystalline nature of the evaporated Co surface prior to anneal. The layer comprising cobalt that has been subjected to anneal reveals a different XRD pattern. For example, the Co(0002) or Co(111) peak at 44° for CVD annealed Co (1000° C. for 10 min) become stronger and narrower at it full width. See FIGS. 2B and 2C. Additionally, anneal causes the weak peaks at 42° and 47° to disappear, which implies improvement in the crystallinity of the annealed cobalt layer. A weak peak at 52° appears, which may be due to Co(200). The XRD pattern of Co surface after graphene formation shows the Co(0002) or Co(111) peak with little less strength because of formation of the graphene layer. See FIG. 2D.

III. Deposition of Graphene Layer

According to some embodiments of the method of the present invention and with reference to FIG. 1C, the multilayer structure comprising the semiconductor substrate 10, a dielectric layer 20, and a layer comprising cobalt 30 may be exposed to a carbon-containing gas to thereby nucleate atomic carbon on the front cobalt layer surface of the layer comprising cobalt 30 and between crystalline cobalt grains.

In some embodiments, the structure is placed in an appropriate chamber, such as a CVD system, and brought to a vacuum, such as a pressure of around 0.1 Pa (about 1 mTorr). Thereafter, the structure is brought to the appropriate anneal temperature in a reducing atmosphere. The temperature for anneal in a reducing atmosphere is generally between about 500° C. and about 1100° C., such as between about 700° C. and about 1000° C. The reducing atmosphere may comprise hydrogen. The atmosphere is preferably a reducing atmosphere, which may comprise between about 1% and about 99% hydrogen, such as between about 70% and about 99% hydrogen, preferably about 95% hydrogen, balance inert gas.

In some embodiments, a carbon-containing gas flow may be added to the reducing gas flow. The carbon-containing gas may be selected from among volatile hydrocarbons, for example, methane, ethane, ethylene, acetylene, propane, propylene, propyne, butane, isobutane, butylenes, butynes, and the like. The carbon-containing gas, e.g., methane, is a source of carbon that may precipitate into graphene according to the process of the present invention. The atmosphere may be a reducing atmosphere, further comprising a reducing gas, such as hydrogen. In some embodiments, the gas may comprise methane gas and hydrogen gas in a ratio from about 1:1 to about 200:1, such as between about 1:1 and about 100:1, such as about 144:15. The minimum temperature during carbon absorption and/or adsorption is generally at least about 500° C. The maximum temperature during carbon absorption and/or adsorption is generally no more than about 1100° C. In general, the temperature is preferably between about 700° C. and about 1000° C. In general, the pressure inside the reaction chamber during hydrogen gas/methane flow is between about 10 Pa (about 0.1 Torr) and about 1500 Pa (about 100 Torr), such as between about 50 P (about 0.4 Torr) and about 150 Pa (about 1 Torr).

Optionally, after the flow of gases is stopped, the structure may be held at the absorption temperature in order to promote equilibrium of nucleation and adsorption between the crystalline cobalt grains. The duration of equilibration after the flow of carbon-containing gas is stopped may range from about 5 seconds to about 3600 seconds, such as about 600 seconds to about 1800 seconds. In some embodiments, the duration of carbon in-diffusion is very short, such as about 10 seconds.

Figure 1D:
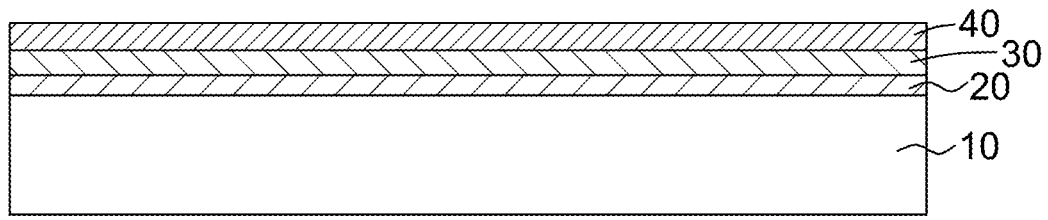

Thereafter, the multilayer structure is rapidly cooled, such as at a rate of at least about 10° C./min, at least about 50° C./min, at least about 100° C./min. In general, the pressure inside the reaction chamber during cooling is between about 10 Pa (about 0.1 Torr) and about 1500 Pa (about 100 Torr), such as between about 50 P (about 0.4 Torr) and about 150 Pa (about 1 Torr). The atmosphere is preferably a reducing atmosphere, which may comprise between about 1% and about 99% hydrogen, such as between about 70% and about 99% hydrogen, preferably about 95% hydrogen, balance inert gas. High temperature growth and rapid cooling enhance the precipitation and surface nucleation fast so that graphene nuclei tries to attach each other preferentially in the same orientation resulting epitaxial growth of large coverage, high quality single-layer graphene. See FIG. 1D, depicting a multilayer structure comprising the semiconductor substrate 10, a dielectric layer 20, a layer comprising cobalt 30, and the single-layer graphene 40.

IV. Graphene Layer Quality Testing

Figure 3:
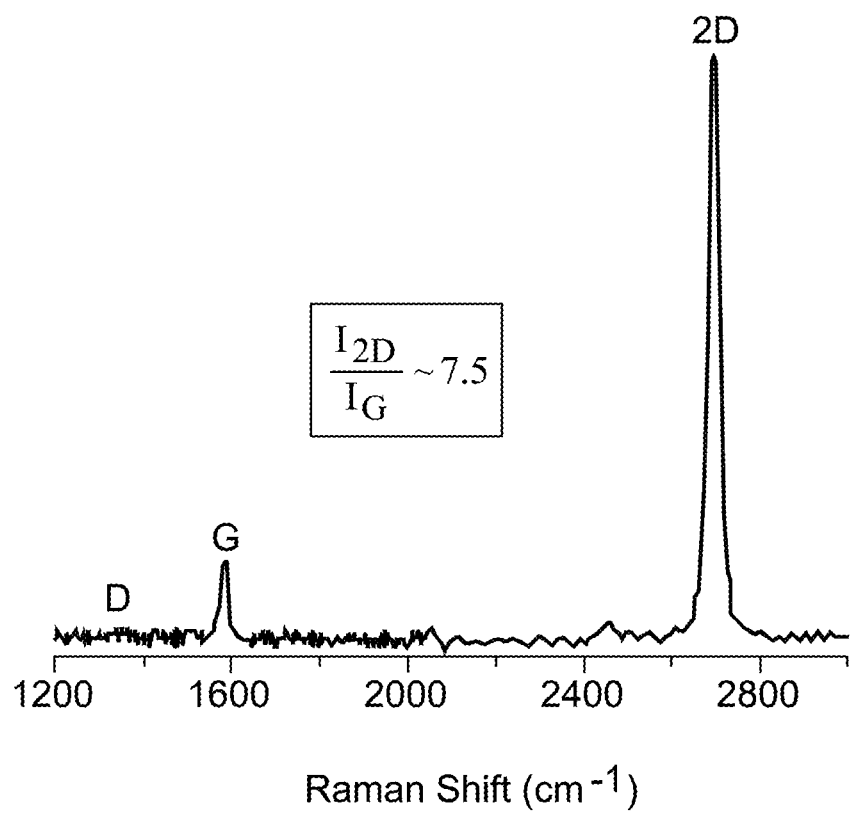
FIG. 3 is Raman spectroscopic analysis of single-layer graphene on Co surfaces. The spectrum shows graphene's characteristic G and 2D-bands with ratio of 7.5 with no D-band.

The deposited and cooled graphene layer 40 in contact with the layer comprising cobalt 30 may be analyzed by Raman spectroscopy to determine the quality of the deposited layer. Raman spectroscopy is a commanding technique to ascertain the number of graphene layers and defects. Raman spectroscopy and 2D mapping to determine the quality of the deposited graphene may be performed with a 532 nm excitation laser. The quality of the deposited graphene may be determined by reference to several bands in the resultant Raman spectrum. See FIG. 3. These bands include: (i) the D band (~1,350 cm$^{-1}$) attributing to the breathing mode of sp$^2$ carbons activated by presence of defects, (ii) the G band (~1,580 cm$^{-1}$) representing the $E_{2g}$ mode of the C-C stretching vibration in the graphitic lattice at the γ-point, and (iii) the 2D band (2,690 cm$^{-1}$) due to the second order two-phonon process in graphene. Additionally, in the representative sample surface (the D-band map), it is also noticed that the intensity ratio i.e. $I_D/I_G$ are negligibly small and near the background level for most of the graphene area, indicating low defect contents and in absence of crystal grain boundaries, which also indicates the formation of single grain graphene. The G-band map and 2D-band map clearly show the presence of single-layer graphene in the whole sample surface. The quality of a single-layer graphene may be determined by the ratio of the intensities of Raman 2D to G-band peaks ($I_{2D}/I_G \geq 2$). This ratio of the intensities of Raman 2D to G-band peaks may be referred to herein as a "quality factor." High quality graphene exhibits a Raman 2D to G-band peak ratio ($I_{2D}/I_G$) or quality factor ratio of at least about 4, such as at least about 7, at least about 7.5, at least about 8, or even at least about 10. Additionally, in high quality graphene, no defect induced D-band is observed. In comparison, $I_{2D}/I_G$ for high-quality exfoliated graphene is about 3-4.

The graphene may be further quality tested by transferring to transmission electron microscopy grids for analysis of the selected area electron diffraction (SAED) patterns. The SAED patterns confirm the hexagonal nature of graphene indicating the d-spacing of 2.15 Å.

The following non-limiting examples are provided to further illustrate the present invention.

Example 1. Cobalt Deposition on Silicon Wafer Substrate

Suitable silicon wafer substrates include:
1. A silicon wafer (n++ type) comprising a SiO$_2$ dielectric having a thickness of 90 nm,
2. A silicon wafer (n++ type) comprising a SiO$_2$ dielectric having a thickness of 300 nm,
3. A silicon wafer (p+ type) comprising a SiO$_2$ dielectric having a thickness of 90 nm, and
4. A silicon wafer (p+ type) comprising a SiO$_2$ dielectric having a thickness of 300 nm, The bulk silicon substrates were obtained from SunEdison Semiconductor, Ltd. (St. Peters, Mo.). The substrates may be provided with thermal silicon oxide layer, or they may be provided without a thermal oxide layer.

The silicon wafers were cleaned using Piranha solution (H$_2$SO$_4$:H$_2$O$_2$=3:1) as necessary for durations between 15 minutes and 2 h. After cleaning and rinsing, a thin film of cobalt having a thickness between about 100 nanometers and about 300 nanometers were deposited on the silicon oxide layers of each wafer. The cobalt layer was deposited via electron-beam evaporation technique in a clean room environment. The instrument used was a Varian Electron Beam Evaporator. The source of cobalt, i.e., the cobalt target, was cobalt pellets having 99.99% purity and approximate dimensions of ¼" diameter×¼" length. The metal evaporation parameters in the reaction chamber were: Pressure: 10$^{-7}$ Torr; Voltage: 10 KV; Current: 45 mA; Tooling factor: 140%; Z-Ratio: 0.343; Density: 8.9 kg/m$^3$; Thickness of the deposited cobalt: 100 nm and 300 nm.

Example 2. Quality Testing of Cobalt Layer

Figure 2A:
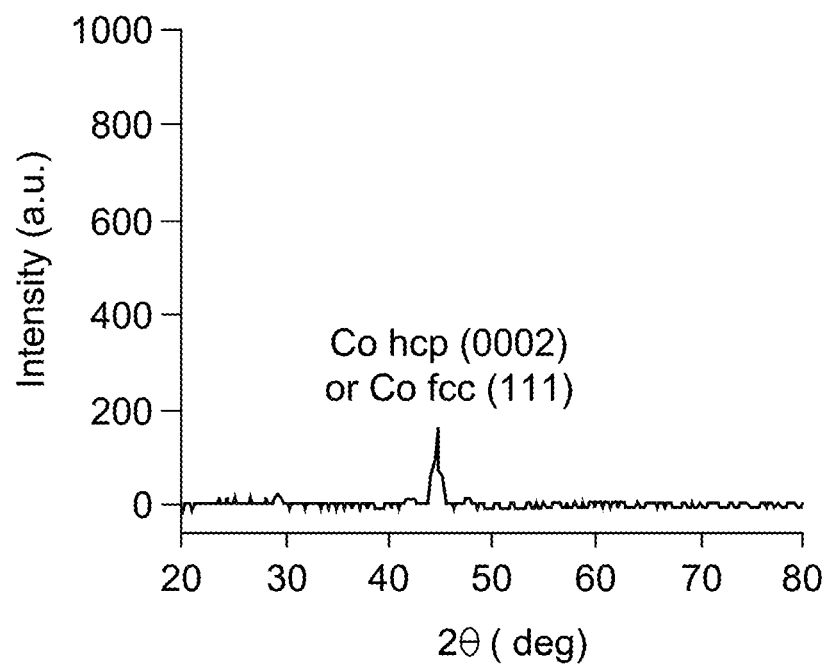
FIGS. 2A through 2D are X-ray diffraction spectra of deposited cobalt layers.
Figure 2B:
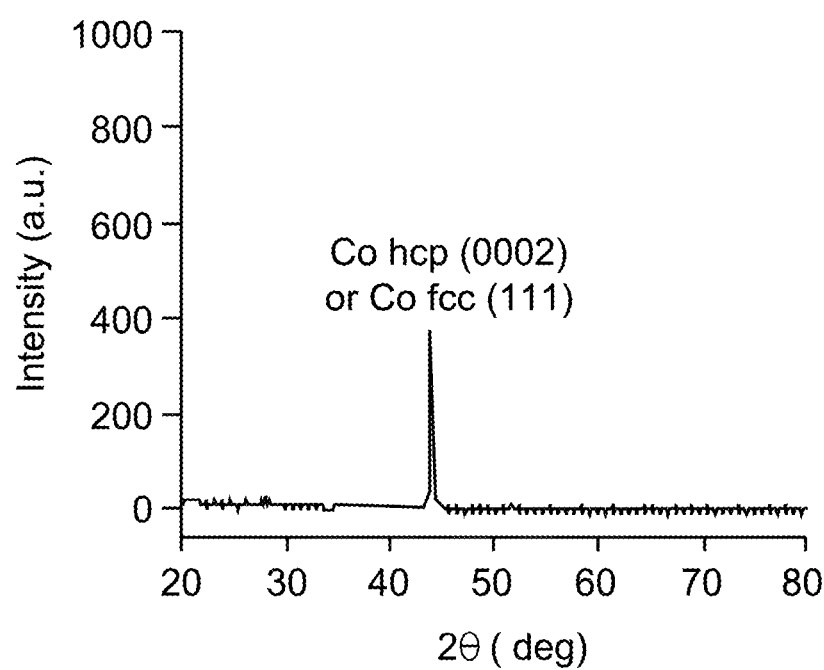
Figure 2C:
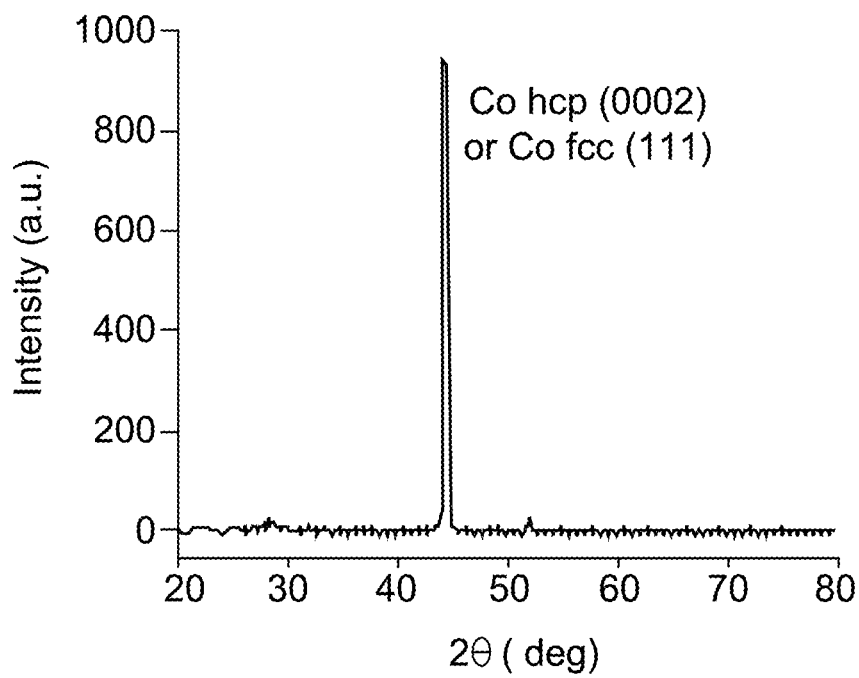
Figure 2D:
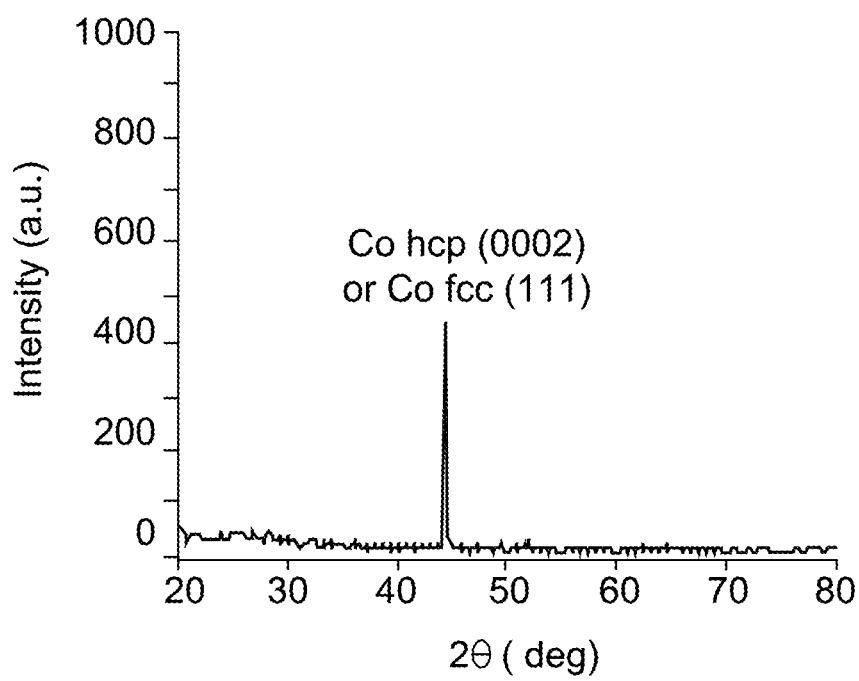

The crystallinity of the cobalt layer is determined both before anneal and after anneal. Crystallinity of the cobalt layer was measured by X-ray diffraction and analysis of the XRD peaks. The multilayer structure (Co/SiO$_2$/Si) prepared according to Example 1 is heat-treated and subsequently analyzed via X-ray diffraction (XRD) to confirm crystallographic orientations. See FIGS. 2A through 2D, which are X-ray diffraction spectra of deposited cobalt layers. FIG. 2A is the spectra after E-beam evaporation according to the parameters set forth in Example 1. FIG. 2B is the spectra after heating to 1000° C. FIG. 2C is the spectra after heating to 1000° C. and annealing for 10 min. FIG. 2D is the spectra after graphene growth. The X-ray diffraction analysis reveals a single crystalline Co film on SiO$_2$/Si substrate, which enables the formation of very-high quality graphene.

The XRD pattern for room temperature (RT) evaporated Co is performed in which three diffraction peaks were observed. See FIG. 2A. The strong peak at 44° corresponds to either hexagonal closed packed (hcp) Co(0002) or face centered cubic (fcc) Co(111) and another two weak peaks are also observed at 42° (CoO (200)) and 47° (hcp Co(101)). These peaks confirm the polycrystalline nature of evaporated Co surface.

The structure is subjected to anneal at 1000° C. for 10 min. See FIG. 2B (at temperature and before anneal) and FIG. 2C (after anneal at 1000° C. for 10 minutes). The Co(0002) and Co(111) peak at 44° in the annealed cobalt layer become stronger and narrower at it full width. The weak peaks at 42° and 47° disappear. The change in XRD peaks confirms improvement in the crystallinity of Co. A weak peak at 52° appears, which may be due to Co(200).

Example 3. Growth of Graphene on the Prepared Substrate Via Chemical Vapor Deposition (CVD)

A CVD system was designed where the substrate (1×1 inches) was placed in a split tube furnace with a fused quartz tube (outside diameter of 1 inch). The precursor gases included methane (CH$_4$) and hydrogen (H$_2$). Initially, the chamber is allowed to achieve a base pressure of 1 mTorr. Substrates prepared according to Example 1 were directly placed in the center of quartz tube's heating zone and heated to 1000° C. in a hydrogen atmosphere at a flow rate of 100 standard cubic centimeters per minute (SCCM) to restrict further oxidation. Right after the temperature reaches 1000° C., the substrates were annealed for 5-10 minutes at the same temperature at a pressure of 500 mTorr in a hydrogen atmosphere at a flow rate of 15 standard cubic centimeters per minute (SCCM). To nucleate carbon on the cobalt surface and between cobalt grains, the gas composition was changed to CH$_4$:H$_2$ at a vol:vol ratio of 144:15. The pressure during methane:hydrogen flow was 1 Torr for 10 minutes. This was followed by cooling at a rate of about 100° C./min. See FIG. 2D for the XRD spectra of the structure after deposition of graphene.

Example 4. Quality Testing of Epitaxially Deposited Graphene on Cobalt

The quality of the epitaxially deposited graphene on cobalt was tested by Raman spectroscopy and 2D mapping with a 532 nm excitation laser. See FIG. 3, which is Raman spectroscopic analysis of single-layer graphene on Co surfaces. The spectrum shows graphene's characteristic G and 2D-bands with ratio of 7.5 with no D-band. The Raman spectrum of the epitaxial graphene exhibited: (i) a negligible D band (~1,350 cm$^{-1}$) attributing to the breathing mode of sp$^2$ carbons activated by presence of defects, (ii) a strong and sharp G band (~1,580 cm$^{-1}$) representing the E$_{2g}$ mode of the C-C stretching vibration in the graphitic lattice at the γ-point, and (iii) a strong and sharp 2D band (~2,690 cm$^{-1}$) due to the second order two-phonon process in graphene. In the representative sample surface (the D-band map), it is also noticed that the intensity ratio, i.e. I$_D$/I$_G$ are negligibly small and near the background level for most of the graphene area, indicating low defect contents and an absence of crystal grain boundaries, which also claims the formation of single grain graphene. The G-band map and 2D-band map clearly show the presence of single-layer graphene in the whole sample surface. The quality of a single-layer graphene may be determined by the ratio of the intensities of Raman 2D to G-band peaks (I$_{2D}$/I$_G$≥2). A superior Raman 2D to G-band peak ratio (I$_{2D}$/I$_G$)>7.5 and no defect induced D-band is observed. In comparison, I$_{2D}$/I$_G$ for high-quality exfoliated graphene is about 3-4.

The graphene is further transferred to transmission electron microscopy grids for analysis of the selected area electron diffraction (SAED) patterns. The SAED pattern confirm the hexagonal nature of graphene indicating the d-spacing of 2.15 Å.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a multilayer structure, the method comprising:
    epitaxially depositing a graphene layer on a layer comprising single crystalline cobalt, wherein the layer comprising single crystalline cobalt is in contact with a dielectric layer, and further wherein the dielectric layer is in contact with a front wafer surface of a silicon wafer, wherein the graphene layer is epitaxially deposited on a front cobalt layer surface of the layer comprising single crystalline cobalt according to the following steps:
    contacting the front cobalt layer surface of the layer comprising single crystalline cobalt with a carbon-containing gas and hydrogen gas at a temperature sufficient to nucleate carbon atoms on the front cobalt layer surface, wherein the vol:vol ratio of the carbon-containing gas and the hydrogen gas is at least 1:1; and
    precipitating carbon atoms to thereby epitaxially deposit the layer of graphene on the front cobalt layer surface, wherein the graphene layer has a quality factor of at least 4, wherein the quality factor is determined by the ratio of peak intensities of a Raman 2D band to a Raman G band.

2. The method of claim 1 wherein the silicon wafer comprises the front wafer surface, a back wafer surface, and a circumferential wafer edge joining the front wafer surface and the back wafer surface.

3. The method of claim 1 wherein the silicon wafer comprises a dopant selected from the group consisting of boron (p type), gallium (p type), phosphorus (n type), antimony (n type), and arsenic (n type), and any combination thereof.

4. The method of claim 1 wherein the dielectric layer comprises one or more of a silicon dioxide layer, a silicon nitride layer, a silicon oxynitride layer, or a multilayer comprising a silicon dioxide layer and a silicon nitride layer.

5. The method of claim 1 wherein the layer comprising single crystalline cobalt comprises the front cobalt layer surface, a back cobalt layer surface, and a bulk cobalt layer region between the front cobalt layer surface and the back cobalt layer surface, wherein the back cobalt layer surface is in contact with the dielectric layer.

6. The method of claim 5 wherein the layer comprising single crystalline cobalt is formed by depositing cobalt on the dielectric layer in contact with the front wafer surface of the silicon wafer.

7. The method of claim 5 wherein the layer comprising single crystalline cobalt is deposited by a technique selected from the group consisting of sputtering, evaporation, electrolytic plating, and metal foil bonding; and
annealing the structure comprising the silicon wafer, the dielectric layer, and the layer comprising cobalt prior to epitaxially depositing the graphene layer to thereby prepare the layer comprising single crystalline cobalt.

8. The method of claim 5 wherein the layer comprising single crystalline cobalt is between about 50 nanometers and about 20 micrometers thick.

9. The method of claim 5 wherein the layer comprising single crystalline cobalt is between about 50 nanometers and about 10 micrometers thick.

10. The method of claim 5 wherein the layer comprising single crystalline cobalt is between about 50 nanometers and about 1 micrometer thick.

11. The method of claim 1 further comprising:
depositing a layer comprising cobalt on the dielectric layer by a technique selected from the group consisting of sputtering, evaporation, electron-beam evaporation, ion beam evaporation, chemical vapor deposition, electrolytic plating, and metal foil bonding to thereby prepare a structure comprising the silicon wafer, the dielectric layer, and the layer comprising cobalt; and
annealing a structure comprising the silicon wafer, the dielectric layer, and the layer comprising single crystalline cobalt in a reducing atmosphere prior to epitaxially depositing the graphene layer on the layer comprising single crystalline cobalt.

12. The method of claim 1 wherein the ratio of the carbon-containing gas and the hydrogen gas is 144:15.

13. The method of claim 1 wherein the carbon atoms are precipitated by cooling the layer comprising single crystalline cobalt in contact with a dielectric layer.

14. The method of claim 1 wherein the carbon-containing gas is selected from the group consisting of methane, ethane, ethylene, acetylene, propane, propylene, propyne, butanes, butylenes, butynes, and combinations thereof.

15. The method of claim 1 further comprising annealing a structure comprising the silicon wafer, the dielectric layer, and the layer comprising single crystalline cobalt in a reducing atmosphere prior to contacting the layer surface of the layer comprising cobalt with the carbon-containing gas.

16. The method of claim 1 wherein the graphene layer has a single mono-atomic thickness.

17. The method of claim 1 wherein the graphene layer has a quality factor of at least about 7.

18. The method of claim 1 wherein the graphene layer has a quality factor of at least about 7.5.

19. The method of claim 1 wherein a Raman spectrum of the graphene layer exhibits a negligible D band.

* * * * *